United States Patent
St. Romain, II et al.

(10) Patent No.: US 11,126,891 B2
(45) Date of Patent: Sep. 21, 2021

(54) SYSTEMS AND METHODS FOR SIMULATING SENSOR DATA USING A GENERATIVE MODEL

(71) Applicant: Toyota Research Institute, Inc., Los Altos, CA (US)

(72) Inventors: Randall J. St. Romain, II, Ann Arbor, MI (US); Hiroyuki Funaya, Ann Arbor, MI (US); Michael James Delp, Ann Arbor, MI (US)

(73) Assignee: Toyota Research Institute, Inc., Los Altos, CA (US)

(*) Notice: Subject to any disclaimer, the term of this patent is extended or adjusted under 35 U.S.C. 154(b) by 144 days.

(21) Appl. No.: 16/567,328

(22) Filed: Sep. 11, 2019

(65) Prior Publication Data
US 2021/0073584 A1    Mar. 11, 2021

(51) Int. Cl.
| | |
|---|---|
| G06K 9/62 | (2006.01) |
| G06N 5/04 | (2006.01) |
| G06N 3/04 | (2006.01) |
| G06T 19/00 | (2011.01) |
| G06F 30/20 | (2020.01) |

(52) U.S. Cl.
CPC ........... *G06K 9/6257* (2013.01); *G06F 30/20* (2020.01); *G06K 9/6289* (2013.01); *G06N 3/0454* (2013.01); *G06N 5/04* (2013.01); *G06T 19/003* (2013.01)

(58) Field of Classification Search
CPC .... G06K 9/6257; G06K 9/6289; G06F 30/20; G06N 5/04; G06N 3/0454; G06T 19/003
USPC ........................................................ 382/159
See application file for complete search history.

(56) References Cited

U.S. PATENT DOCUMENTS

| | | | |
|---|---|---|---|
| 7,043,057 B2 | 5/2006 | Retterath et al. | |
| 9,786,084 B1 | 10/2017 | Bhat et al. | |
| 9,796,400 B2 | 10/2017 | Puttagunta et al. | |
| 2009/0299496 A1* | 12/2009 | Cade .................. | G05B 17/02 700/29 |
| 2010/0094790 A1 | 4/2010 | Gnojewski | |
| 2011/0060478 A1 | 3/2011 | Nickolaou | |
| 2014/0122409 A1 | 5/2014 | Na et al. | |
| 2016/0014395 A1 | 1/2016 | Murray et al. | |
| 2016/0178802 A1 | 6/2016 | Olshansky | |
| 2017/0345140 A1 | 11/2017 | Zhang et al. | |
| 2017/0351952 A1 | 12/2017 | Zhang et al. | |
| 2018/0188733 A1 | 7/2018 | Iandola et al. | |

(Continued)

OTHER PUBLICATIONS

Wang, "On the quantitative assessment of the Lane Departure Warning System based on road scenes simulator" 2012 IEEE International Conference on Machine Learning and Cybernetics. Publication year 2012.*

(Continued)

*Primary Examiner* — Juan A Torres
(74) *Attorney, Agent, or Firm* — Christopher G. Darrow; Darrow Mustafa PC

(57) ABSTRACT

System, methods, and other embodiments described herein relate to simulating sensor data for a scene. In one embodiment, a method includes, in response to receiving a request to generate simulated sensor data for the scene, acquiring simulation data about the scene. The simulation data includes at least simulated information about the scene that is computer-generated. The method includes computing the simulated sensor data using a generative neural network that accepts the simulation data as an input and produces the simulated sensor data as an output. The simulated sensor data is a simulated perception of the scene by a sensor. The method includes providing the simulated sensor data as part of the scene.

19 Claims, 7 Drawing Sheets

(56) References Cited

U.S. PATENT DOCUMENTS

| | | |
|---|---|---|
| 2018/0194286 A1 | 7/2018 | Stein |
| 2018/0233047 A1* | 8/2018 | Mandeville-Clarke ...................... B60W 30/00 |
| 2018/0275658 A1 | 9/2018 | Iandola et al. |
| 2018/0349526 A1 | 12/2018 | Atsmon et al. |
| 2019/0122441 A1 | 4/2019 | Agrawal et al. |
| 2019/0179979 A1* | 6/2019 | Melick .................... G06F 30/20 |
| 2019/0228118 A1* | 7/2019 | Hummelshoj ......... G06N 20/00 |
| 2019/0228495 A1* | 7/2019 | Tremblay ............... G06T 1/0014 |
| 2019/0303759 A1* | 10/2019 | Farabet ................ G06K 9/4628 |
| 2019/0355257 A1* | 11/2019 | Caldwell ................ G08G 1/166 |
| 2019/0370666 A1* | 12/2019 | Ros Sanchez ......... G06N 3/088 |
| 2020/0065665 A1* | 2/2020 | Nageshrao ........... G06N 3/0454 |
| 2020/0074233 A1* | 3/2020 | England ................ G01S 7/4808 |
| 2020/0086863 A1* | 3/2020 | Rosman ................. G06N 3/088 |
| 2020/0151508 A1* | 5/2020 | Yang .................... G06K 9/6268 |
| 2020/0209858 A1* | 7/2020 | Trofymov ................ G06N 3/08 |
| 2020/0311986 A1* | 10/2020 | Tong ....................... B60R 11/04 |
| 2021/0012486 A1* | 1/2021 | Huang ...................... G06T 5/00 |

OTHER PUBLICATIONS

Kaushik, "Overtaking Maneuvers in Simulated Highway Driving using Deep Reinforcement Learning", 2018 IEEE Intelligent Vehicles Symposium (IV). Publication year: 2018.*

Peng et al., "Synthetic to Real Adaptation with Generative Correlation Alignment Networks," arXiv:1701.05524v3 [cs.CV,] Mar. 18, 2017, pp. 1-10.

Jing et al., "Neural Style Transfer: A Review," arXiv:1705.04058v1 [cs.CV,] May 11, 2017, pp. 1-14.

Luan et al., "Deep Photo Style Transfer," arXiv:1703.07511v3 [cs.CV,] Apr. 11, 2017, pp. 1-9.

Goodfellow et al., "Generative Adversarial Nets," arXiv:1406.2661v1 [stat.ML,] Jun. 10, 2014, pp. 1-9, Montreal, QC H3C 3J7.

Shrivastava et al., "Learning from Simulated and Unsupervised Images Through Adversarial Training," arXiv:1612.07828v2 [cs.CV,] Jul. 19, 2017, pp. 1-16, Pub. Apple Inc.

Zhang, "StackGAN++: Realistic Image Synthesis with Stacked Generative Adversarial Networks," arXiv:1710.10916v2 [cs.CV,] Dec. 25, 2017, pp. 1-14.

Gaidon, Virtual Worlds as Proxy for Multi-Object Tracking Analysis, arXiv:1605.06457v1 [cs.CV,] May 20, 2016, pp. 1-10.

Zhu et al., "Unpaired Image-to-Image Translation using Cycle-Consistent Adversarial Networks," arXiv:1703.10593v6 [cs.CV,] Nov. 15, 2018, pp. 1-18.

Isola et al., "Image-to-Image Translation with Conditional Adversarial Networks," arXiv:1611.07004v2 [cs.CV,] Nov. 22, 2017, pp. 1-17.

* cited by examiner

SYSTEMS AND METHODS FOR SIMULATING SENSOR DATA USING A GENERATIVE MODEL

TECHNICAL FIELD

The subject matter described herein relates, in general, to systems and methods for generating simulations for training machine learning models, and, in particular, to generating sensor data that simulates at least intensity data from a light detection and ranging (LiDAR) or similar device by using a generative adversarial network (GAN).

BACKGROUND

Machine perception and understanding of electronic information is a complex task. For example, machines (e.g., robots) generally use electronic sensors such as cameras, LiDAR, and other sensors to acquire information about a surrounding environment. The information from these sensors takes different forms such as still images, video, point clouds, and so on. Understanding the contents of the information generally involves complex processing that can encounter many difficulties. In one approach, a system may implement a machine-learning algorithm to perform a particular perception task such as detecting objects within provided image data. While machine learning algorithms can be effective at such tasks, the accuracy of the algorithms generally depends on the training data, and, in particular, the quantity, diversity, and quality of training data that the machine learning algorithm uses to learn the task.

However, acquiring training data that satisfies these conditions can represent a significant difficulty. For example, collecting actual sensor data generally involves driving a vehicle over many miles and through many different environments to collect raw data, which may then be manually labeled for training. Additionally, manually collecting and labeling sensor data is inefficient and often includes inaccuracies from errors associated with a manual labeling process. Moreover, the acquired sensor data may be incomplete or derived from different types of sensors that provide the data in different formats. That is, camera images may have a limited color range (e.g., grayscale), LiDAR sensors may have lower fidelity or capture information with limited characteristics (e.g., only range data), and so on. Thus, available sensor data for training may not include a comprehensive assessment of the environment for a particular sensor type. As a result of using training data with various limitations to train a machine learning model, the machine learning model may develop inherent limitations in understanding the surrounding environment. Accordingly, difficulties with accurately training machine learning models persist.

SUMMARY

In one embodiment, example systems and methods relate to a manner of simulating sensor data. Thus, in one or more aspects, a disclosed approach includes a machine learning model to support generating simulated sensor data or at least a portion of the sensor data. For example, in one embodiment, the system implements a machine learning model to have a particular architecture that, for example, accepts a representation of a simulated scene and infers additional attributes that correspond with the sensor data thereby simulating aspects of the sensor data.

In various approaches, the system implements the machine learning architecture to generate the sensor data from the simulated scene which is, for example, a computer-generated representation of an environment that is relevant to a particular model that is to be trained. That is, the present system or another system initially generates the simulated scene to depict circumstances that are relevant to the model that is to be trained. Thus, in various approaches, the simulated scene may depict a road scene including traffic signs, pedestrians, vehicles, etc. or another type of scene (e.g., surveillance scene) that is specific to the training task.

In any case, the system acquires the simulated scene and provides the scene as electronic input into a machine learning model. In one approach, the system implements the machine learning model as a generative model such as a generative adversarial network (GAN) with cycle consistency. Accordingly, the generative model produces the simulated sensor data using the information about the simulated scene (e.g., semantic labels, range information, etc.). The simulated sensor data can include intensity data for a LiDAR and/or other information as the GAN may be trained to generate.

Thus, as an aspect of training the GAN, the system, in one approach, implements a discriminator, which is a separate neural network (e.g., a convolutional neural network (CNN)) that facilitates training the GAN using a self-supervised or unsupervised training process. The discriminator attempts to determine when provided information is real (e.g., real intensity data) or fake (e.g., generated by the GAN) thereby directing the GAN to produce realistic data. In yet a further aspect, the overall network architecture includes a second generative network and a second discriminator to support the cycle consistency of the architecture by implementing an inverse mapping in comparison to the generative network that produces the simulated sensor data. The inverse mapping can include inferring the simulated scene or at least a portion of the information from the scene, such as semantic labels and range data. The particular configuration of the second discriminator and the second generative network are, for example, similar to the first but function to produce the separate set of information, which is at least part of an input to the first generative network. In this way, the overall network architecture implements a cycle-consistency loss that improves the functioning of the GAN to produce more accurate simulated sensor data.

In one embodiment, a simulation system for simulating at least a portion of a scene is disclosed. The simulation system includes one or more processors and a memory communicably coupled to the one or more processors. The memory stores an input module including instructions that when executed by the one or more processors cause the one or more processors to, in response to receiving a request to generate simulated sensor data for the scene, acquire simulation data about the scene. The simulation data includes at least simulated information about the scene that is computer-generated. The memory further storing a simulation module including instructions that when executed by the one or more processors cause the one or more processors to compute the simulated sensor data using a generative neural network that accepts the simulation data as an input and produces the simulated sensor data as an output. The simulated sensor data is a simulated perception of the scene by a sensor. The simulation module includes instructions to provide the simulated sensor data as part of the scene.

In one embodiment, a non-transitory computer-readable medium for simulating at least a portion of a scene and including instructions that when executed by one or more processors cause the one or more processors to perform one or more functions is disclosed. The instructions include instructions to, in response to receiving a request to generate simulated sensor data for the scene, acquiring simulation data about the scene, wherein the simulation data includes at least simulated information about the scene that is computer-generated. The instructions include instructions to compute the simulated sensor data using a generative neural network that accepts the simulation data as an input and produces the simulated sensor data as an output. The simulated sensor data is a simulated perception of the scene by a sensor. The instruction include instructions to provide the simulated sensor data as part of the scene.

In one embodiment, a method for simulating at least a portion of a scene is disclosed. In one embodiment, a method includes, in response to receiving a request to generate simulated sensor data for the scene, acquiring simulation data about the scene. The simulation data includes at least simulated information about the scene that is computer-generated. The method includes computing the simulated sensor data using a generative neural network that accepts the simulation data as an input and produces the simulated sensor data as an output. The simulated sensor data is a simulated perception of the scene by a sensor. The method includes providing the simulated sensor data as part of the scene.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be designed as multiple elements or multiple elements may be designed as one element. In some embodiments, an element shown as an internal component of another element may be implemented as an external component and vice versa. Furthermore, elements may not be drawn to scale.

DETAILED DESCRIPTION

Figure 1:
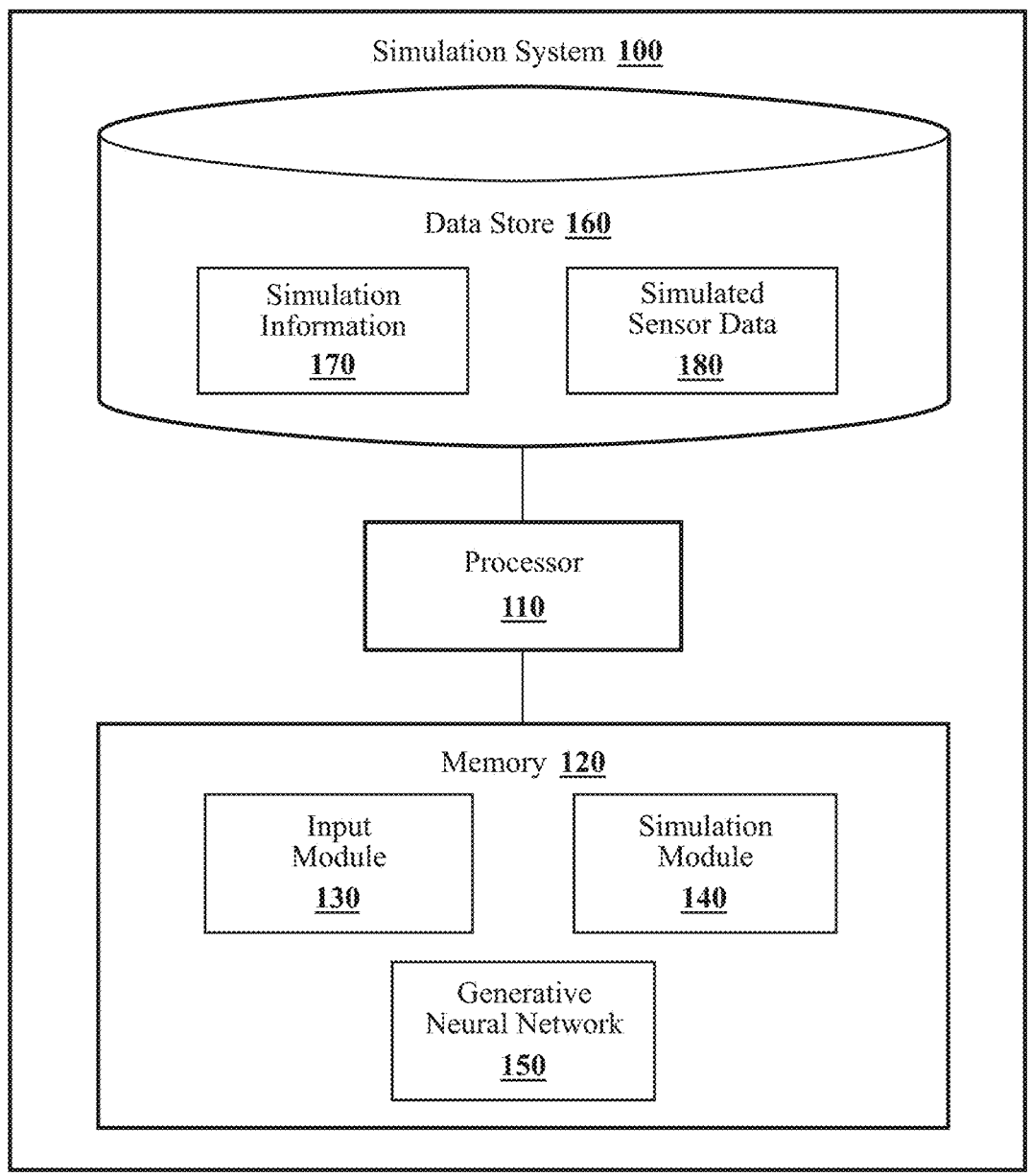
FIG. 1 illustrates one embodiment of a simulation system that is associated with using a generative neural network to simulate at least a portion of a scene.

Systems, methods, and other embodiments associated with simulating at least part of a scene are disclosed. As mentioned previously, the quantity/quality of training data dictates how well a machine learning model learns a particular task and, by extension, how well the model performs. For example, if a simulation is lacking in quality due to a lack of true-to-life sensor data, then a model trained using the simulation may suffer from gaps in understanding that develop as inaccurate determinations by the model (e.g., inaccurate classifications, planning, etc.). In either case, shortcomings within a simulation from which training data is derived can carry over into the understanding of the machine learning model such that the model generally may not perform to the same standards as when an improved training set is applied.

Moreover, some techniques for simulating sensor data such as ray-tracing are computationally intensive and suffer from inaccuracies since each separate point is individually simulated through tracing geometric paths back to the point of observation while also using heuristics in an attempt to estimate properties that can factor into values for the information. Accordingly, existing approaches generally suffer from difficulties that limit how effectively data for training a model may be simulated.

Therefore, in one embodiment, a simulation system provides for simulating sensor data in a robust manner to improve the quantity, quality, and diversity of training data. Thus, in one or more aspects, a disclosed approach includes a machine learning model to support generating the simulated sensor data. For example, in one embodiment, the system implements a machine learning model to have a particular architecture that, for example, accepts a representation of a simulated scene and infers additional attributes that correspond with the sensor data thereby simulating aspects of the sensor data.

In various approaches, the system implements the architecture to generate the simulated sensor data from the simulated scene without using real sensor data as an underlying basis of the simulated sensor data. That is, the system generates the simulated sensor data from a simulated scene and information about the simulated scene without using partial real sensor data as a starting point from which to generate the simulated sensor data. Thus, the present system provides for a robust mechanism to generate the simulated sensor data and a broader simulated scene from which models may be trained.

Accordingly, the scene is, for example, a computer-generated representation of an environment that is relevant to and generally customized for a particular model that is to be trained. That is, the present system or another system initially generates the simulated scene to depict circumstances and particular arrangements thereof that are relevant to the model that is to be trained. By way of example, in various approaches, the simulated scene may depict a road scene including traffic signs, pedestrians, vehicles, etc., which can be selected, placed, and provided in various arrangements to present a wide variety of possible scenes. For example, the system can generate scenes of various rare occurrences (e.g., blind left turn across oncoming traffic) in multiple configurations to better train a model without actually encountering such dangerous and rare circumstances and while also providing accurate simulations of sensor data. In a further aspect, the type of scene can include an exemplary surveillance scene or another particular arrangement that is specific to the training task. In any case, the system is adaptable and able to generate the scene in a desired form along with the associated simulated sensor data that may be used to improve the simulation from the perspective of various sensors that perceive the scene.

Accordingly, the system acquires the simulated scene and provides the scene as electronic input into a machine learning model. Thus, the system may derive the inputs from information inherent in the scene such as semantic labels for represented objects, distances to objects and parts of the objects according to pose, and so on. However, certain aspects may not be provided by a rendering engine that generates the simulation such as intensity values of LiDAR returns (i.e., intensities of reflected light from a LiDAR scan), and so on.

As such, in one approach, the system implements a machine learning model as a generative model such as a generative adversarial network (GAN) with cycle consistency to simulate the additional aspects of the sensor data that are not available directly from the simulation. Accordingly, the generative model produces the simulated sensor data using the information about the simulated scene (e.g., semantic labels, range information, etc.). The simulated sensor data can include intensity data for a LiDAR and/or other information as the GAN may be trained to generate.

As an aspect of training the GAN, the system, in one approach, implements a discriminator, which is a separate neural network (e.g., a convolutional neural network (CNN)) that facilitates training the GAN. The discriminator attempts to determine when provided information is real (e.g., real intensity data) or fake (e.g., generated by the GAN) as an approach to training the GAN. Thus, when the network can generate sufficiently realistic simulated sensor data that the discriminator cannot distinguish between the simulated sensor data and real sensor data, the network is achieving quality results. The network architecture generally implements a loss function that includes an adversarial loss embodying the noted output of the discriminator and from which the system trains the generative network.

In yet a further aspect, the overall network architecture of the GAN includes a second generative network and a second discriminator. The second generative network performs an inverse mapping in relation to the first generative network. In one approach, the inverse mapping can include inferring the simulated scene or at least a portion of the information from the scene, such as semantic labels. The particular configuration of the second discriminator and the second generative network are generally similar to the first but function to produce the information that is at least part of an input to the first generative network while operating on an output of the first network (i.e., simulated sensor data) and thereby providing an inverse mapping.

Accordingly, as part of training the GAN using cycle consistency, the system implements a further aspect of the loss function that is a consistency loss. The consistency loss involves the second network reproducing inputs to the first network from outputs of the first network and vice versa. Thus, the system uses these reproduced inputs to assess how well the network is performing. In one approach, the simulation system produces the consistency loss according to this process and adapts the networks as a further aspect of training according to the consistency loss. In this way, the overall network architecture implements a cycle-consistency loss that improves the functioning of the GAN to produce more accurate simulated sensor data.

Consequently, the system can simulate a comprehensive perception of an environment when possessing a basis for the data from a simulation. In this way, the system supports generating improved simulations through inference and thereby improves the efficiency of generating the information to enhance the simulation. Accordingly, the simulation system improves the generation of labeled training data such that comprehensive depictions of different scenes can be efficiently generated to improve training data for various machine learning tasks overall.

Referring to FIG. 1, one embodiment of a simulation system 100 is illustrated that is implemented to perform methods and other functions as disclosed herein relating to generating simulated sensor data using a generative neural network. As an initial matter, it should be appreciated, that while the simulation system 100 is illustrated as being a single discrete system, in various embodiments, the simulation system 100 is a distributed system that is comprised of components that can be provided as a centralized server, a cloud-based service, and so on.

As an additional note, while the simulation system 100 is generally applicable to many different contexts within which machine learning models may be implemented, in one or more embodiments, the simulation system 100 is implemented to at least support advanced driving assistance (ADAS) functions, semi-autonomous functions and/or an autonomous driving functions (e.g., self-driving) as may be implemented by a computerized module. As one example, an autonomous driving module, in one approach, is comprised of a plurality of sub-modules that each perform a respective task in relation to autonomously operating a vehicle. The sub-modules may, in combination or individually, determine travel path(s), current autonomous driving maneuvers for the vehicle, future autonomous driving maneuvers, modifications to current autonomous driving maneuvers, identification of obstacles/objects, and so on. Thus, to effectively function, the simulation system 100 initially trains the individual task-specific sub-modules using training data depicting different scenarios that the vehicle may encounter.

However, as previously noted, acquiring adequate training data can represent a significant difficulty especially in relation to training data that depicts dangerous or otherwise rare occurrences. Therefore, the simulation system 100 can be employed to generate a simulation that depicts particular scenes and from which the system 100 can populate the scene with simulated sensor data by inferring the simulated sensor data from existing aspects of the simulation. Accordingly, the simulation system 100, in one embodiment, provides a simulation including the simulated sensor data as a mechanism to efficiently train modules on associated tasks.

With further reference to FIG. 1, the simulation system 100 is shown as including a processor 110. Accordingly, the processor 110 may represent a distributed processing resource, an individual local processor (e.g., a CPU, GPU, or application-specific processor), or the simulation system 100 may access the processor 110 through a data bus or another communication path. In one embodiment, the simulation system 100 includes a memory 120 that stores an input module 130 and a simulation module 140. The memory 120 is a random-access memory (RAM), read-only memory (ROM), a hard-disk drive, a flash memory, a processor cache, or other suitable memory for storing the modules 130 and 140. The modules 130 and 140 are, for example, computer-readable instructions that when executed by the processor 110 cause the processor 110 to perform the various functions disclosed herein. The simulation system 100 is further illustrated as including a generative neural network 150. The generative neural network 150, as will be discussed in greater detail subsequently, is generally a combination of multiple networks and may include various pre/post-processing functions along with the networks.

Moreover, as previously noted, in various embodiments, one or more aspects of the simulation system 100 are implemented as cloud-based services, or other remote networked services. Thus, one or more components of the simulation system 100 may be located remotely from other components and may be implemented in a distributed manner. As an additional matter, the simulation system 100 includes a data store 160 as a means of storing various data elements. The data store 160 is, in one embodiment, an electronic data structure stored in the memory 120 or a separate electronic storage. In one embodiment, the data store 160 is a database that is configured with routines that can be executed by the processor 110 for analyzing stored data, providing stored data, organizing stored data, and so on. Thus, in one embodiment, the data store 160 stores data used by the modules 130 and 140 in executing various functions. In the embodiment depicted in FIG. 1, the data store 160 includes simulation information 170 (also referred to as simulation data herein), simulated sensor data 180, and/or other information such as may be used by the modules 130 and/or 140.

In general, the simulation information 170 includes, in one or more embodiments, range data. That is, the simulation information 170 includes three-dimensional reference points in the scene that are, in one approach, in the form of point clouds as perceived by a LiDAR sensor. The simulation information 170 does not generally include other data that may be produced by a sensor that the simulation system 100 is simulating such as intensity data (e.g., amplitude values for perceived returns), but includes semantic information about the scene as is available from the simulation. That is, the simulation system 100 uses a three-dimensional rendering engine (e.g., a game engine) that defines objects, properties of objects (e.g., colors, materials, etc.), poses of the objects in relation to a reference point (e.g., a point of observation of a sensor), spatial relationships/positions, environmental conditions (e.g., weather, lighting, etc.), and so on. As such, the simulation includes certain intrinsic properties that are known, such as distances to various surfaces, spatial relationships of objects, identities of objects, and so on. Thus, from this information, the simulation system 100 acquires the simulation information 170 to use as an input to the network 150.

Accordingly, in various approaches, the particular form of the simulation information 170 may vary but generally includes depth/range data (e.g., as could be perceived from stereo images, monocular images with a depth channel, pseudo-LiDAR from vision, radar data (active or passive), LiDAR data, and so on). As such, the approaches discussed herein are not limited specifically to LiDAR range information but are generally applicable to range information about a simulated scene from which the simulation system 100 can simulate intensity data and thereby broadly simulate sensor data for a computer-generated simulation of an environment.

In further embodiments, the simulation information 170 also includes labels of objects depicted within the simulation information 170. That is, the simulation system 100 acquires the simulation information 170 along with semantic labels that identify classes of objects within the simulation information 170. Since the identities, poses, and other information is known about each separate object represented in the simulated scene, the simulation system 100 intrinsically knows the semantics labels. Accordingly, the simulation system 100 may generate discrete, separate semantic labels from the known information about the scene or simply pass the representation of the scene including information identifying the objects to the model 150 as part of the simulation information 170.

Furthermore, the simulated sensor data 180 is generally discussed as intensity data, which may take different forms depending on the particular form of the simulation information 170 itself. That is, while the simulated information 170 is generally a secondary attribute (e.g., intensity) of the sensor data as opposed to a primary attribute (e.g., range), the particular form can vary. In one embodiment, the simulated sensor data 180 is the amplitude of a reflected light wave in contrast to an originally emitted light wave from a LiDAR (e.g., 10-20% of original amplitude). In further examples, the intensity is simply the pixel brightness of a passively observed point within the environment, a radar return value, sonar return value, etc. Thus, the simulated sensor data 180 may vary according to which type of sensor the simulation system 100 is simulating, and, thus, the simulation module 140 can simulate the data 180 according to the type of sensor being simulated. That is, depending on whether the network 150 is trained to simulate LiDAR data, image data, radar data, etc., the network 150 produces the simulated sensor data 180 in a form to mimic actual sensor data from the sensor being simulated.

Additionally, the generative neural network 150 may also be implemented in different forms. For example, as noted previously, the generative neural network 150 is an artificial neural network such as a generative adversarial network (GAN), and can be implemented as, in one or more embodiments, an encoder/decoder structure (e.g., convolutional neural network feeding into a deconvolutional neural network), an autoencoder, a variational autoencoder (VAE), or another deep learning architecture that analyzes simulation information of a simulated scene and infers sensor data 180 therefrom. Moreover, in one or more approaches, the network 150 includes one or more pre-processing transformations, and/or one or more post-processing transformations to further simulate the data 180.

For example, the transformations can include formatting conversions, filters, and/or other processes to prepare (e.g., provide in a format similar to perceived sensor data generally provided by a sensor) the simulation information 170 for processing by the network 150. In a still further aspect, the transformations can include flattening 3D data into a 2D representation for processing via a 2D backbone, grouping points from a point cloud into voxels, and so on.

Moreover, in a further aspect, the network 150 may also include at least one discriminator. The discriminator, in one embodiment, is a separate artificial neural network such as a convolutional neural network (CNN) or other deep neural network architecture. The discriminator generally functions to support training the network 150 by, for example, discriminating between outputs of the network 150 and training data that includes real sensor data. That is, the discriminator encourages the network 150 to produce outputs that are indistinguishable from real data by, for example, computing an adversarial loss embodying whether the output of the network 150 is indistinguishable or not.

In a further aspect, as will be discussed in greater detail with the subsequent figures, the network architecture of the network 150 can further include additional neural networks to support further unsupervised training processes such as cycle consistency between a first generative network that computes the simulated sensor data 180, and a second generative network (not illustrated) implemented to perform an inverse mapping (e.g., sensor data to simulation information) of the first generative network and which provides a basis for determining a cycle consistency loss. It should be appreciated that the cycle consistency loss functions to further regularize the mappings between the two separate networks and capture the intuition that translating from one domain to the other (e.g., simulation information to simulated sensor data and sensor data to simulation information) should produce the same original simulation information if the networks are cyclically consistent, as shown in equations (1) and (2).

$$x \to G(x) \to F(G(x)) \approx x \quad (1)$$

$$y \to F(y) \to G(F(y)) \approx y \quad (2)$$

Where x represents an input of the simulation information, G(x) represents the first generative network, F(x) represents the second generative network, equation (1) represents a forward cycle-consistency loss, and equation (2) represents a backward cycle-consistency loss, which are defined relative to the primary function (i.e., generating simulated sensor data). In this way, the network 150 leverages transitivity as a way to enforce consistency.

Figure 2:
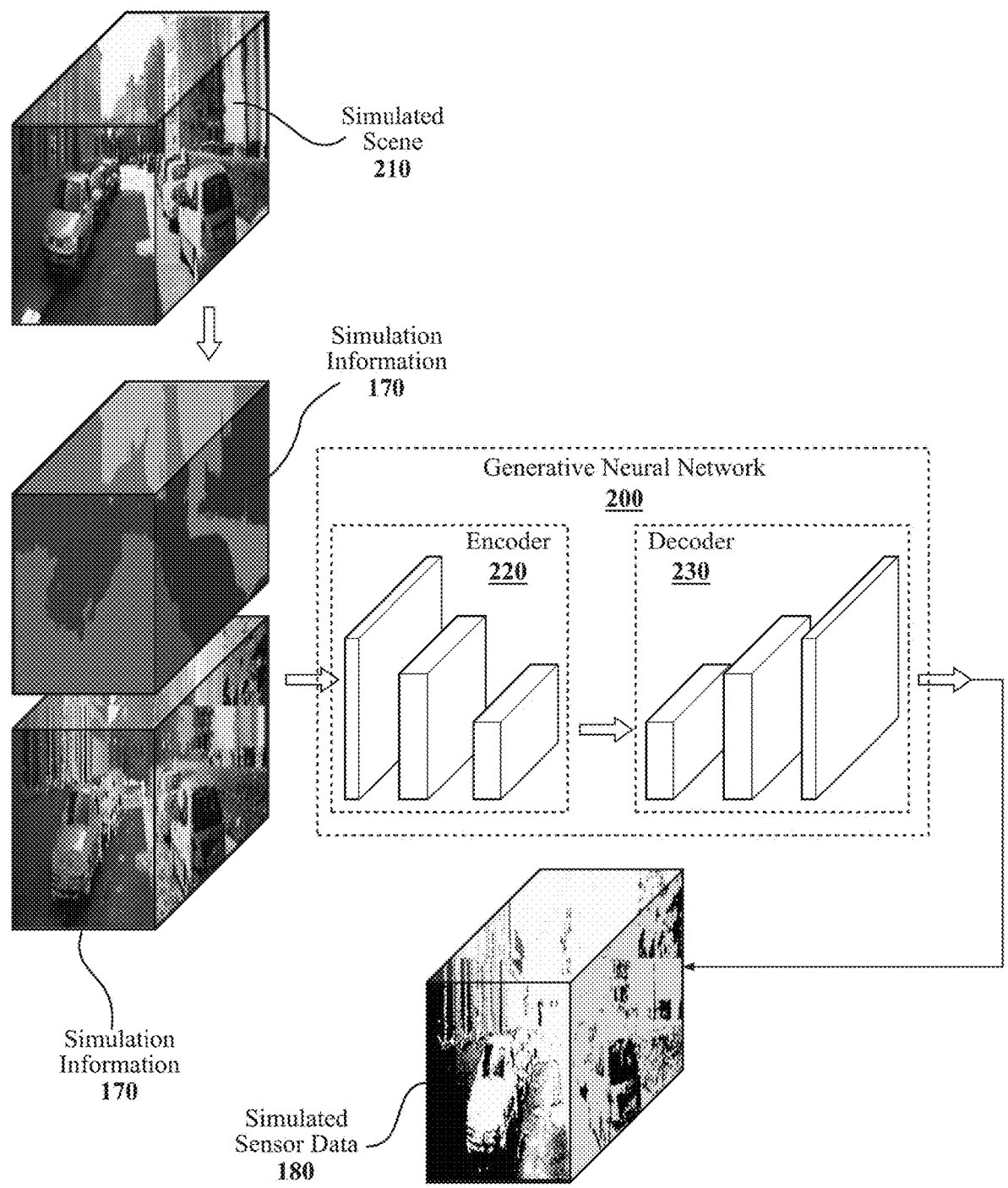
FIG. 2 illustrates one example of an architecture of a generative neural network.

As one example of an implementation of the generative neural network 150, consider FIG. 2, which illustrates a network 200. The network 200 illustrates the 3D input of simulation information 170 from a simulated scene 210 that is passed directly into the network 200. It should be appreciated that while the simulation information 170 is illustrated as two separate sets of data (e.g., semantic labels, and range data), in one or more approaches, the data may be combined into a single electronic data structure. Moreover, although not explicitly illustrated, the simulation system 100 may implement functionality to generate the simulation itself or simply harvest the simulation information from the simulation. That is, the simulation system 100 may analyze the simulated scene 210 to extract and thereby acquire the simulation information 170 to provide as an input into the generative neural network 200.

In any case, the generative network 200 is, in one or more embodiments, comprised of an encoder-decoder structure, including an encoder 220 and a decoder 230, that generates the simulated sensor data 180 using a process of neural style transfer (also referred to as sensor transfer or modality transfer). In one approach, the network 200 includes two stride-2 convolutions, multiple residual blocks, two fractionally-strided convolutions with a stride of ½, and so on. Depending on a particular implementation (e.g., dimensions of inputs), the number and size of the residual blocks may vary. In still further aspects, the encoder-decoder structure is comprised of convolutional and deconvolutional layers that generally function to encode features depicted in the simulation information 170 and then reconstruct the features in a desired form (e.g., as an intensity mapping). It should be appreciated that the particular arrangement of layers may vary according to the implementation. Moreover, the particular form of the network 200 may also vary to include additional separate networks that support the overall function of the network 200. In either case, the network 200 functions to generate the simulated sensor data 180.

With continued reference to FIG. 1 and the general functionality of the simulation system 100, the input module 130, in one embodiment, generally includes instructions that function to control the processor 110 to monitor for and receive a request to generate the simulated sensor data 180 associated with a simulated scene. In one or more approaches, the request is embodied as the simulation information 170 itself and the occurrence of the system 100 receiving the simulation information 170. That is, simply receiving the simulation information 170 functions as the request to generate the data 180.

In a further aspect, the request is a distinct set of data that may be received by the system 100 coincident with the simulation information 170 or separately. Accordingly, the input module 130, in one embodiment, may receive a distinct electronic request. The request may be generated through an electronic interface with a user, through an automated internal process for generating training data sets, from a simulator or other electronic source that generates requests to train a particular model, and so on. In any case, the request induces the system 100 to compute the simulated sensor data 180 and, thus, can include instructions specific to the generation of the simulated sensor data 180. In one embodiment, the request includes additional information to accompany the simulation information 170 such as characteristics of a sensor that is being simulated (e.g., type of LiDAR), and/or other metadata that may influence how the simulated sensor data 180 is computed (e.g., a selection between different available versions of the network 150 that may be associated with different sensors).

In still further aspects, the request can include instructions about how the simulated sensor data 180 is to be provided (e.g., a particular format). For example, the request can indicate a subsequent use of the data 180, such as whether the sensor data 180 is to be included as training data for a particular task, and so on. Generally, the noted additional aspects of the request can serve as the basis for adjusting the processing by the system 100 and/or how the data 180 is ultimately provided. Moreover, the request may also indicate a particular storage location or other procedural aspects for acquiring the simulation information 170 for processing.

Additionally, in one embodiment, the input module 130 may derive the simulation information 170 from the simulation by, for example, generating the semantic labels and/or translating the range/depth data into a format representative of the particular sensor being simulated. In one embodiment, the labels are semantic labels identifying at least a class (e.g., vehicle, pedestrian, traffic sign) of each represented object on, for example, a per point basis or at least according to general boundaries of the object. In further aspects, the labels provide additional characteristics such as surface types (e.g., asphalt, concrete, glass, painted metal, etc.), colors, reflectivities, and so on. Thus, the input module 130 may separately implement a deep neural network or another algorithm that extracts data from the simulated scene about the objects and generates the semantic labels.

In yet a further embodiment, the input module 130 functions to generate the simulation of the scene itself. That is, the input module 130 includes a 3D simulation engine including at least a rendering engine and may also include a physics engine and/or other modules to support simulating the scene. As such, the input module 130, in one approach, accepts general descriptions of a scene that may include specifications of positions, objects, and other attributes to be included with the scene and simulates the scene using the simulation engine to realize the described scene. In any case, whether the input module 130 directly simulates the scene or acquires the simulated scene from a secondary source, the input module 130 acquires the simulation information 170 including at least depth/range data and semantic labels of the scene to provide as an input to the network 150.

With continued reference to FIG. 1, the simulation module 140 includes instructions that when executed by the processor 110 cause the processor 110 to compute the simulated sensor data 180 as a function of the generative neural network 150. As previously described, the generative neural network 150 accepts the simulation information 170 and, in at least one embodiment, may perform various pre-processing transformations on the data to prepare the data for input and processing by the network 150.

The simulation module 140 computes the simulated sensor data 180 (e.g., intensity data) using the network 150 and the learned correlations embodied within the network 150 to infer the simulated sensor data 180 from the simulation information 170 (e.g., range data and semantic labels). Thus, the learned correlations account for material properties of the labeled objects, geometric relationships of the objects in relation to an observation point (e.g., position of the perceiving sensor), object size, shape, and other aspects that influence the intensity of reflected light.

It should be appreciated that the simulation module 140, in various embodiments, is integrated with the network 150. That is, in one or more approaches, the simulation module 140 includes instructions, algorithms, and other aspects related to the network 150 to effectively implement the network 150. Thus, while the network 150 is illustrated as a separate component, in one or more aspects, the simulation module 140 and the network 150 are at least partially integrated together. Moreover, one or more data structures storing hyper-parameters and/or other aspects may be further integrated with the simulation module 140.

Additionally, the simulation module 140 provides the simulated sensor data 180, in one embodiment, as an integrated part of the simulated scene. In one or more embodiments, the simulation module 140 appends or otherwise associates the simulated sensor data 180 with the corresponding aspects of the scene as an output in the form of, for example, an intensity mapping. In a further aspect, the simulation module 140 provides the intensity map as a separate data structure that generally maps intensity values to separate objects and portions of objects in the scene. In this way, the simulation system 100 can provide the simulation of the scene as a training aid with accurate built-in training data for training one or more machine learning tasks (e.g., autonomous driving tasks associated with machine perception, path planning, obstacle avoidance, etc.).

Continuing with further aspects of the simulation module 140, in one or more embodiments, the simulation module 140 further includes instructions to train the generative neural network 150. In one approach, the simulation module 140 performs an unsupervised learning process to train the network 150, which may include using training data. Accordingly, the training data includes, in at least one approach, real sensor data and the simulation information 170 from a training set. The unsupervised training process for the network 150 uses the real sensor data to, for example, determine an adversarial loss according to determinations of a discriminator network that is separate from the network 150 yet part of the overall architecture. Moreover, as briefly outlined above, the simulation module 140 may implement a loss function to include not only the adversarial loss but as a cycle consistency loss. Further aspects of training the network 150 will be discussed subsequently.

Figure 3:
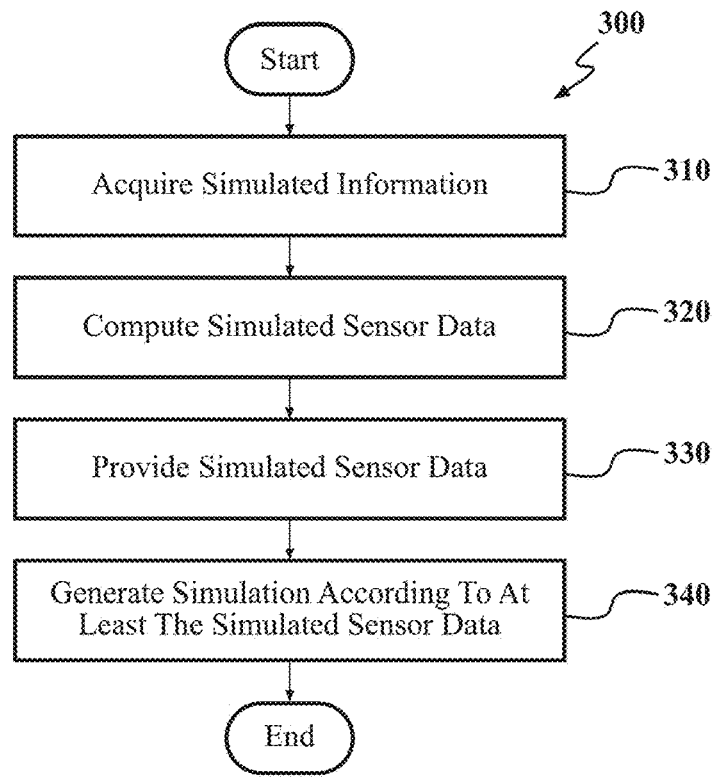
FIG. 3 illustrates a flowchart of one embodiment of a method associated with generating simulated sensor data.

Additional aspects of simulating sensor data will be discussed in relation to FIG. 3, which illustrates a flowchart of a method 300. Method 300 will be discussed from the perspective of the simulation system 100 of FIG. 1. While method 300 is discussed in combination with the simulation system 100, it should be understood that the method 300 is not limited to being implemented within the simulation system 100 but is instead one example of a system that may implement the method 300.

At 310, the input module 130 monitors for a request to compute the simulated sensor data 180. As noted previously, in one or more embodiments, the input module 130 may receive an explicit request to generate simulated sensor data 180 or an embedded request that corresponds to receiving the simulation information 170 itself. Moreover, in one embodiment, the request is for a single set of the simulation information 170 (e.g., a single scene), whereas, in further embodiments, the request may specify a plurality of scenes corresponding with distinct sets of simulation information 170. In either case, the request generally induces the input module 130 to acquire the simulation information 170 by, for example, performing one or more of: generating the simulation of the scene using a simulation engine, extracting the information 170 from a simulated scene, formatting the information 170 according to input characteristics of the network 150, and so on.

As previously specified, the simulation information 170 includes at least range information and semantic labels for aspects of the simulated scene. The input module 130 may undertake different processes to acquire the simulation information 170 but generally acquires the information 170 from the simulated scene which may be directly generated by the system 100 or acquired from a data store such as a cloud-based repository. In either case, the simulation information 170 is comprised of range information that can be in a three-dimensional format such as distances to various points in the scene that are provided to replicate a 3D point cloud of LiDAR returns. Consequently, the input module 130 may undertake pre-processing of the range data to replicate a density and/or pattern as may occur within a point cloud of LiDAR returns.

As a further aspect and also as previously explained, the input module 130, in one or more embodiments, acquires the simulation information 170, at 310, including acquiring the labels for objects represented in the simulation information 170. This process may take different forms and can include acquiring the labels from intrinsic information included within the simulated scene and/or generating the labels to correspond with points of the point cloud from information included within the simulated scene. That is, the input module 130, in one approach, uses class identifiers for the objects depicted in the scene to label points of the range data. In this way, the input module 130 can use the simulated scene to construct the inputs for the network 150.

At 320, the simulation module 140 computes the simulated sensor data 180. The simulation module 140 computes the simulated sensor data 180 using the network 150 to infer the data 180 from the simulation information 170. Thus, the process of computing the simulated sensor data 180 involves using learned correlations embodied within the network 150 as opposed to heuristics or physics models that perform ray tracing and other complex and inefficient analysis of an environment to estimate the data 180. The network 150 accounts for particular aspects of the objects such as reflectivities, geometric relationships, material properties, and other aspects that are intrinsically embodied within the learned correlations as developed according to the training process as explained further subsequently. In either case, the simulation module 140 provides for, in one embodiment, inferring the intensity data from inputs including range information and semantic labels.

At 330, the simulation module 140 provides the simulated information with the simulation information 170. In one embodiment, providing the simulated sensor data 180 includes, for example, generating an intensity map for the simulated scene that correlates the simulated sensor data 180 with aspects of the scene. In general, the intensity map is an electronic data structure that includes the simulated sensor data 180, and mappings to the scene according to the simulation information 170. In one approach, the intensity map correlates with the scene via assigned coordinates originating from a position of the perceiving sensor. Whichever approach is undertaken, the simulated sensor data 180 is mapped into the scene to provide a clear correlation between the data 180 and the perceived aspects of the scene.

At 340, the simulation module 140 generates a simulation. In one embodiment, the simulation module 140 generates the simulation according to at least the simulated sensor data 180. For example, in one approach, the simulation module 140 populates the scene, which is a computer-generated environment, using the simulated sensor data 180. Thus, the scene then includes information that can be selectively fed into, for example, a task-specific module as a manner of training such a module according to a scenario that involves the scene (e.g., perceiving an oncoming vehicle when turning onto a roadway). As such, the system 100 effectively simulates sensor data that would be provided to the module under actual operating conditions, and the system 100 can thereby train the module to perceive similar real-world scenarios. The inclusion of the simulated sensor data 180 ensures that the perceptions provided to the module are comprehensive and representative of actual sensor data, thereby improving the training of the module even though real sensor data depicting the scene may be unavailable.

In a further aspect, the simulation module 140 provides the simulated sensor data 180, including the range data, as an electronic output. In one embodiment, the sensor data is stored in a memory (e.g., memory 120, data store 160, or another electronic data store) for use by the simulation of the scene when needed. In this way, the simulation system 100 functions to improve the creation of sensor data for training and thereby also improve the training of associated modules, which translates to the overall functioning of autonomous vehicle systems that use the trained modules.

Aspects relating to training a machine learning model to simulate sensor data will be discussed in relation to FIG. 4, which illustrates a flowchart of a method 400. Method 400 will be discussed from the perspective of the simulation system 100 of FIG. 1. While method 400 is discussed in combination with the simulation system 100, it should be understood that the method 400 is not limited to being implemented within the simulation system 100 but is instead one example of a system that may implement the method 400.

At 410, the simulation system 100 acquires a set of training sensor data. In one embodiment, the simulation module 140 receives training data as part of initializing the network 150 to induce the system 100 to train the network 150. The training data, in one approach, is a set of real sensor data, which may be combined with additional information from a real perceived scene. Thus, the training data may include labels of object instances depicted therein and also includes both primary (e.g., range data) and secondary attributes (e.g., intensity data). Furthermore, the training data can also include separate sets of simulation data Moreover, the real sensor data (i.e., produced by a sensor as opposed to being simulated) generally depicts a set of scenes that are related to an overall focus of the simulation system 100. Thus, the real sensor data may depict driving scenes (e.g., roadways with vehicles, pedestrians, and other transportation-related aspects) if directed to providing data for driving-related activities. In one approach, the real sensor data depicts a varied assortment of object instances for different classes and of different characteristics within each class in order to provide a comprehensive data sampling for training. Similarly, the set of simulation information 170 that also comprises the training data is varied to provide a wide assortment of data.

In general, the simulation system 100 acquires the training sensor data from a source such as a real sensor (e.g., LiDAR) that is affixed to a vehicle and that stores data including the primary (e.g., range) and secondary attributes (e.g., intensity data). In one or more approaches, the training data may be crowd-sourced from vehicles having the particular sensor such as fleet vehicles and/or personal vehicles that opt-in to providing such data. In still a further aspect, a mapping/surveying vehicle may collect the training data and provide the training data for use by systems such as the simulation system 100. Furthermore, the training data, in certain approaches, may undergo manual labeling and/or other processes for preparation.

At 420, the simulation module 140 computes the simulated sensor data 180. In general, the simulation module 140 executes the network 150 over the training data in a similar manner as discussed in relation to block 320 of FIG. 3. Thus, for purposes of brevity in this description, the explanation will not be repeated. However, it should be understood that the simulation module 140 functions to generate the simulated sensor data 180 at 420 for purposes of subsequent processing by a discriminator to provide an adversarial loss and/or a second generative network to provide a cycle-consistency loss. In the case of producing the cycle-consistency loss, the simulated sensor data 180 may be generated from either the simulation information 170 of the training data set or from an output of the second generative network, as will be explained in greater detail subsequently.

At 430, the simulation module 140 determines a loss for adjusting parameters of the network 150. In general, the simulation module 140 computes the loss according to a loss function. The loss function, in one embodiment, includes multiple different components. For example, the loss function can include an adversarial loss and a cycle-consistency loss. The adversarial loss indicates, in at least one embodiment, an objective loss associated with a discriminator identifying whether the simulated sensor data 180 is computer-generated or real.

Figure 5:
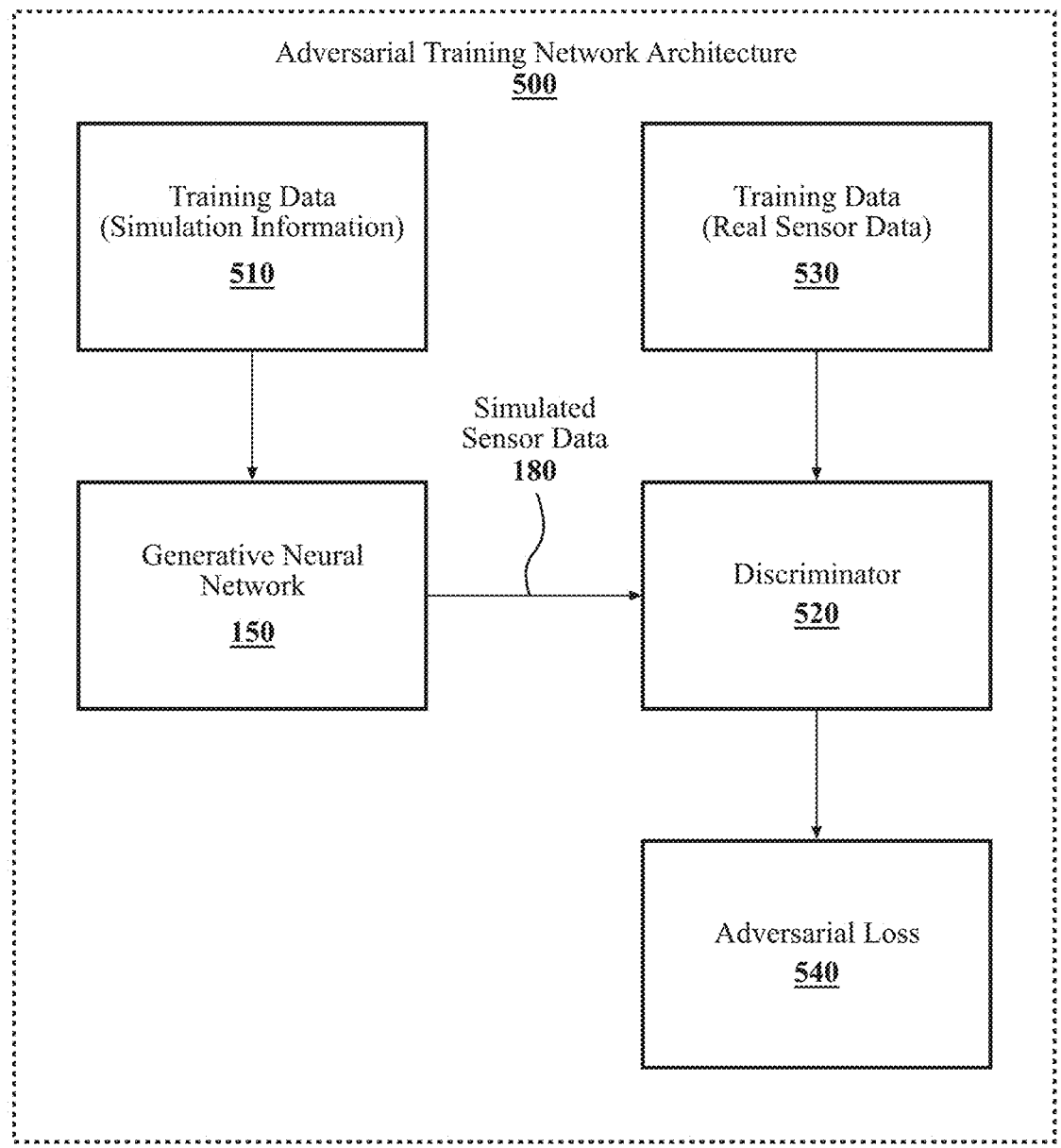
FIG. 5 illustrates one arrangement of an architecture for the adversarial training of a neural network.

As a further explanation of the adversarial loss, consider FIG. 5, which illustrates an adversarial training network architecture 500 in relation to the network 150 (i.e., first generator) that computes the simulated sensor data 180. As shown in FIG. 5, the first generator 150 processes the training data 510, which is generally the same as the simulation information 170, and outputs the result (the simulated sensor data 180) to a discriminator 520. The discriminator 520 is, in one embodiment, an artificial neural network (ANN), which may take different forms as previously described. In any case, the discriminator 520 accepts the simulated sensor data 180 and additional training data 530, which generally includes real sensor data (e.g., real intensity data). The discriminator attempts to distinguish whether the training data 530 and the simulated sensor data are real (i.e., provided form an actual sensor) or fake (i.e., computer-generated). The discriminator 520 generates the adversarial loss 540 using the loss function to quantize this analysis from which the simulation module 140 can adapt the network 150 at 440. Similarly, as will become clearer with the discussion of FIGS. 6-7, a second generative neural network (not illustrated) is trained using a second discriminator (not illustrated) on the inverse mapping of the generative neural network 150. However, the training of the first generative neural network 150 generally does not include a factor in the loss function for adversarial training of the second generative neural network even though the second network is separately trained using a separate adversarial loss.

Continuing with the description of the loss function, the simulation module 140 further computes the cycle-consistency loss. The cycle-consistency loss indicates a transitive relationship between learned mappings of the first generative network 150 and the second generative network (e.g., network 600 from FIG. 6). Thus, the cycle-consistency loss, in one or more embodiments, includes at least two components, a forward cycle consistency, as illustrated in Equation (1) above, and a backward cycle consistency, as illustrated in Equation (2) above.

Figure 6:
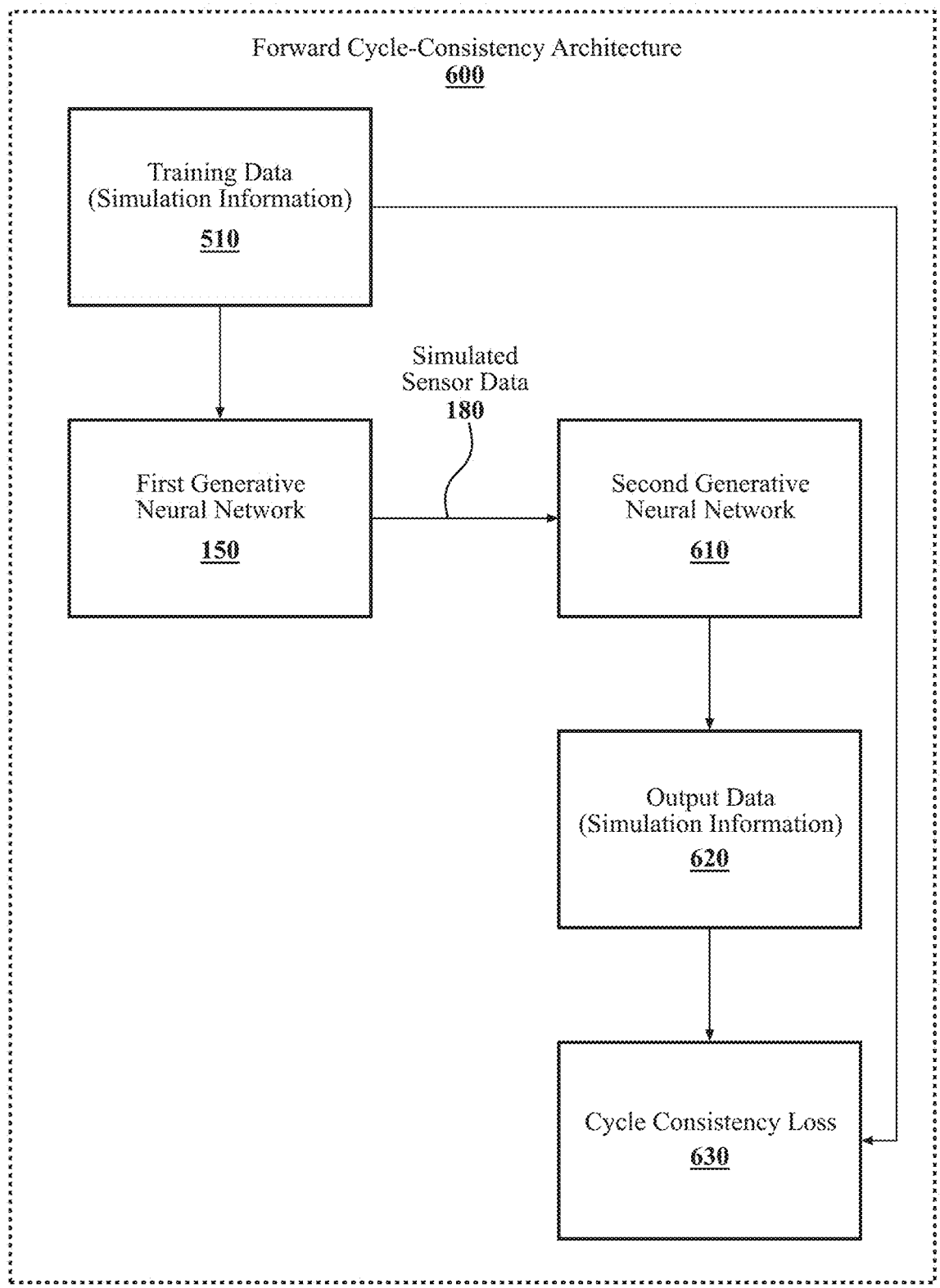
FIG. 6 illustrates one arrangement of an architecture for training a neural network according to a forward cycle consistency.
Figure 7:
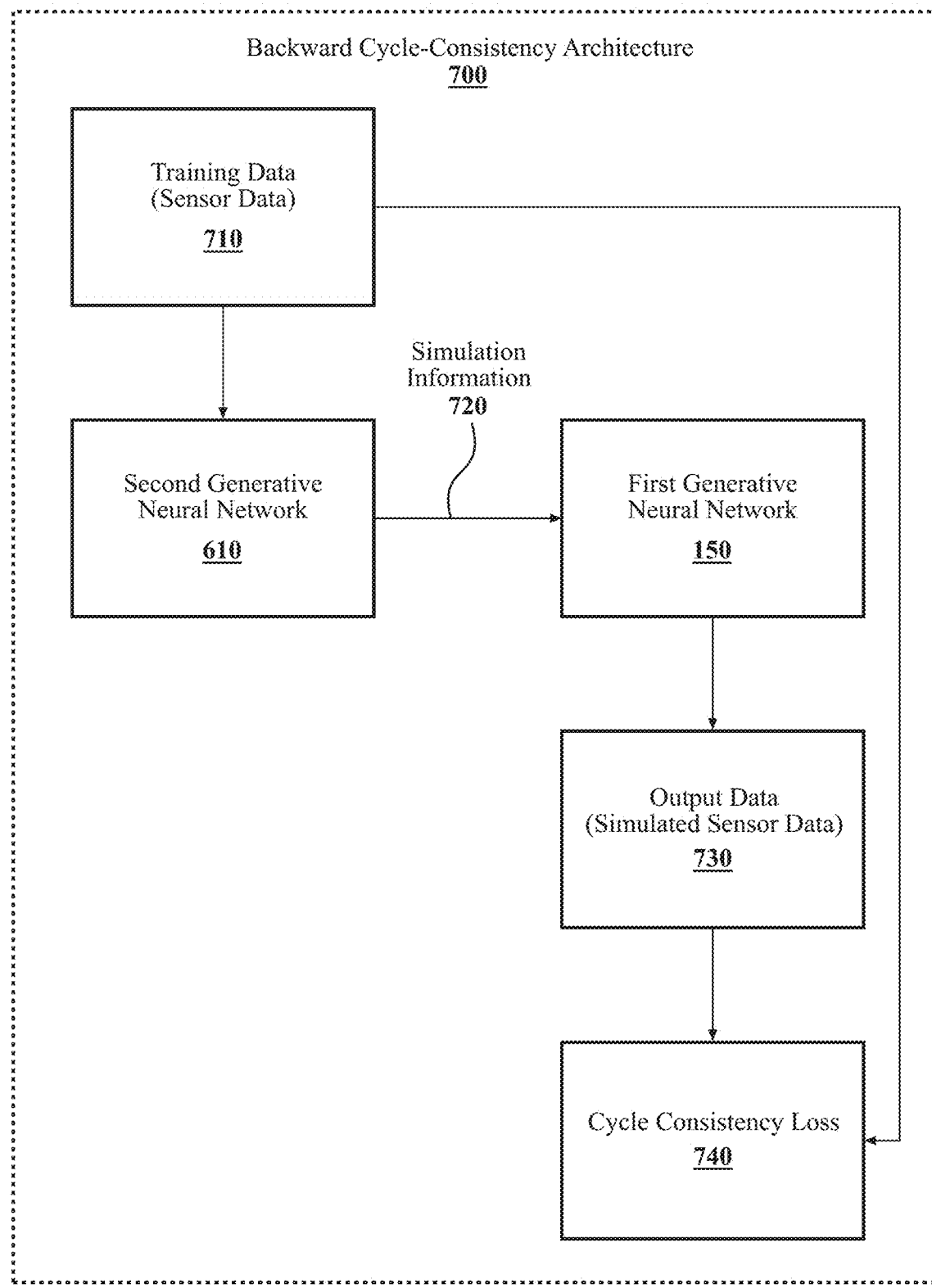
FIG. 7 illustrates one arrangement of an architecture for training a neural network according to a backward cycle consistency.

Accordingly, consider FIGS. 6 and 7, which illustrate a forward cycle-consistency architecture 600 and a backward cycle-consistency architecture 700 for training the network 150. As illustrated in FIG. 6, the network 150 functions similar to a normal configuration in operating on the simulation information 170 (provided as training data 510) and providing the simulated sensor data 180 as an output. However, the simulated data 180 is an input to the second generative neural network 610, which performs the inverse mapping of the network 150. That is, the network 610 accepts sensor data as an input and produces the simulation information (i.e., range and semantic labels) as an output 620, thereby performing an inverse operation in relation to the network 150. The simulation module 140 then applies the loss function to the original input to the network 150 in comparison to the output 620 to produce the forward cycle-consistency loss 630, the output 620 representing a reproduction of the data 510. Accordingly, differences in the data 510 and 620 embody the loss 630 of the networks 150 and 610 inferring respective information.

With reference to FIG. 7, in a similar manner as shown in FIG. 6, the second generative neural network 610 accepts training data 710 (i.e., sensor data such as simulated intensity data) as an input and produces corresponding simulation information 720 (e.g., range data and semantic labels), which is provided as an input to the network 150. The network 150 operates on the information 720 to produce the output data 730. Accordingly, the simulation module 140 computes the backward cycle-consistency loss 740 through a comparison of the data 710 and the data 730. In this way, the system enforces consistency between mappings of the respective networks 150 and 610 to improve training.

Figure 4:
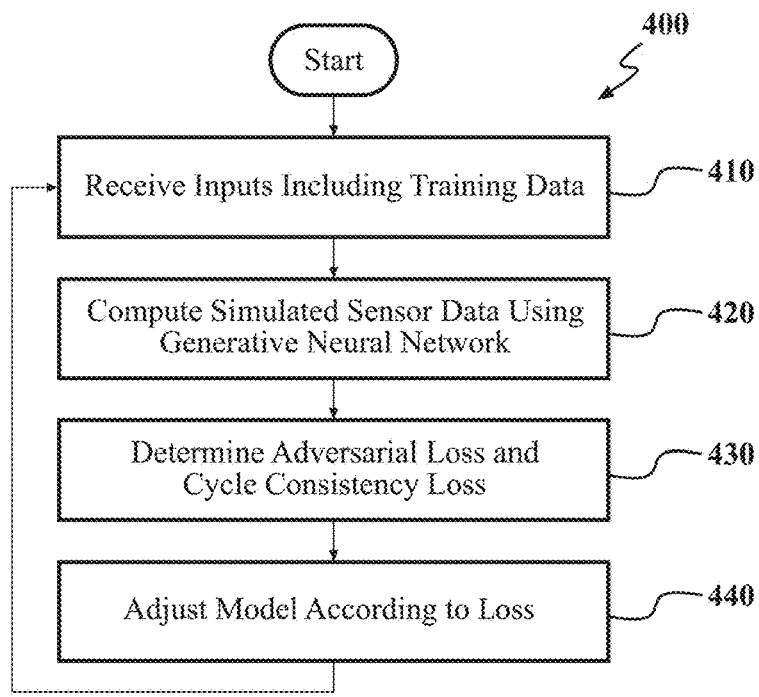
FIG. 4 illustrates a flowchart of one embodiment of a method associated with training a generative neural network according to an unsupervised training process.

Continuing with FIG. 4, at 440, the simulation module 140 adjusts parameters of the generative neural network 150 according to the loss. That is, the simulation module 140 backpropagates the loss into internal nodal weights (e.g., hyper-parameters) of the generative neural network 150 to adjust how the generative neural network 150 processes the inputs. In further aspects, the simulation module 140 computes a separate loss using at least a portion of the cycle-consistency loss to train the second generative network.

According to this mechanism, the generative neural network 150 intrinsically learns the correlations between the inputs and the outputs so that subsequent iterations of the generative neural network 150 provide improved outputs. In general, the method 400 is executed iteratively over a large training set to provide sufficiently accurate results for inferring the simulated sensor data 180 (e.g., intensity data of a LiDAR). In this way, the system 100 can train the network 150 using an unsupervised training process that functions without paired input-output training examples.

Figure 8:
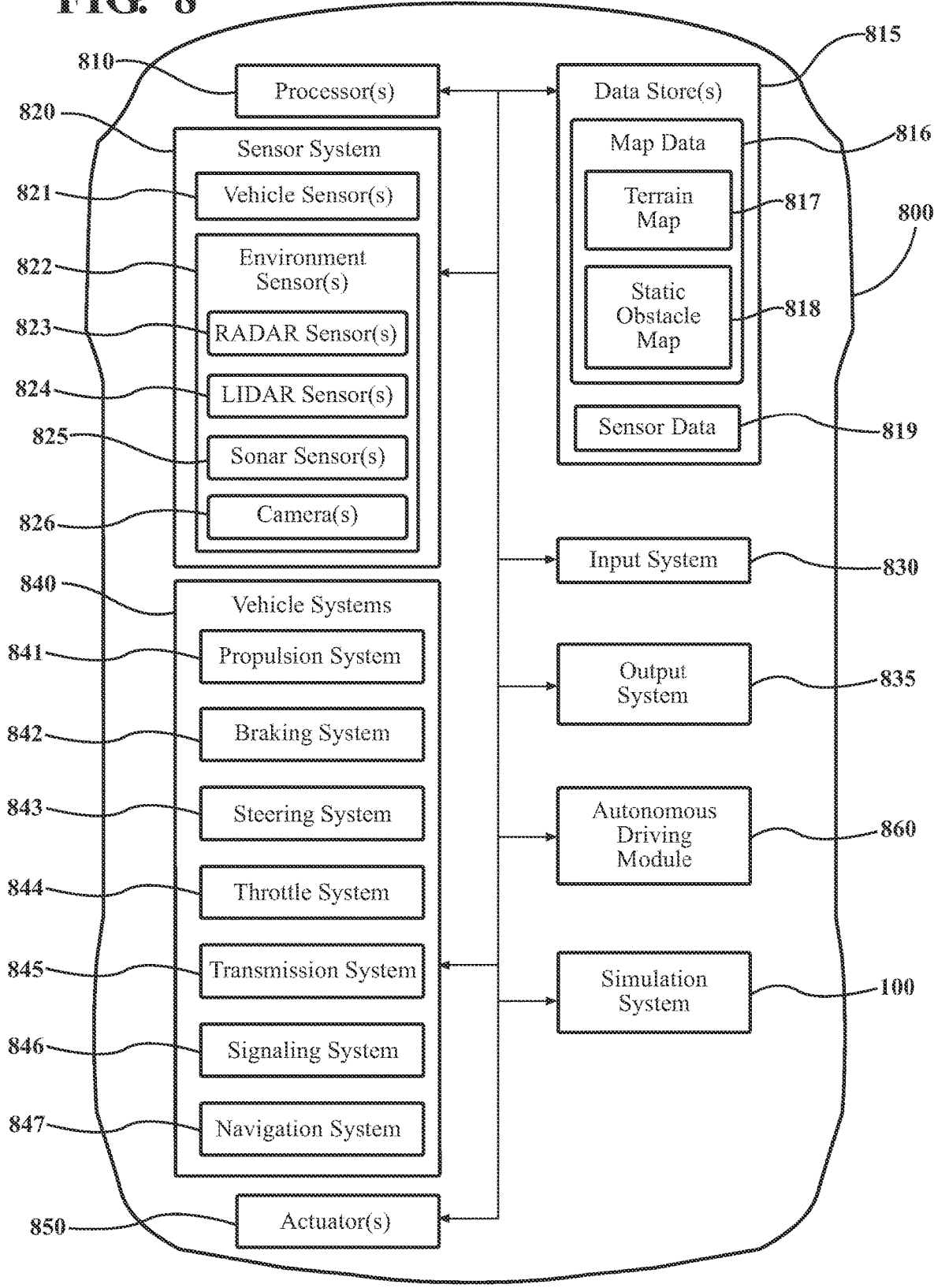
FIG. 8 illustrates one embodiment of a vehicle within which systems and methods disclosed herein may be implemented.

As an additional example of an implementation of at least a portion of the simulation system 100, an example vehicle 800 will now be discussed in relation to FIG. 8. FIG. 8 represents an example environment within which the system and methods disclosed herein may operate. In some instances, the vehicle 800 is configured to switch selectively between an autonomous mode, one or more semi-autonomous operational modes, and/or a manual mode. Such switching can be implemented in a suitable manner, now known or later developed. "Manual mode" means that all of or a majority of the navigation and/or maneuvering of the vehicle is performed according to inputs received from a user (e.g., human driver). In one or more arrangements, the vehicle 800 can be a conventional vehicle that is configured to operate in only a manual mode.

In one or more embodiments, the vehicle 800 is an autonomous vehicle. As used herein, "autonomous vehicle" refers to a vehicle that operates in an autonomous mode to self-drive without control inputs from a human driver. "Autonomous mode" refers to navigating and/or maneuvering the vehicle 800 along a travel route using one or more computing systems to control the vehicle 800 with minimal or no input from a human driver. In one or more embodiments, the vehicle 800 is highly automated or completely automated. In one embodiment, the vehicle 800 is configured with one or more semi-autonomous operational modes in which one or more computing systems perform a portion of the navigation and/or maneuvering of the vehicle along a travel route, and a vehicle operator (i.e., driver) provides inputs to the vehicle to perform a portion of the navigation and/or maneuvering of the vehicle 800 along a travel route.

The vehicle 800 can include one or more processors 810. In one or more arrangements, the processor(s) 810 can be a main processor of the vehicle 800. For instance, the processor(s) 810 can be an electronic control unit (ECU). The vehicle 800 can include one or more data stores 815 for storing one or more types of data. The data stores 815 can include volatile and/or non-volatile memory. Examples of suitable data stores 815 include RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The data store 815 can be a component of the processor(s) 810, or the data store 815 can be operatively connected to the processor(s) 810 for use thereby. The term "operatively connected," as used throughout this description, can include direct or indirect connections, including connections without direct physical contact.

In one or more arrangements, the one or more data stores 815 can include map data 816. The map data 816 can include maps of one or more geographic areas. In some instances, the map data 816 can include information or data on roads, traffic control devices, road markings, structures, features, and/or landmarks in the one or more geographic areas. The map data 816 can be in any suitable form. In some instances, the map data 816 can include aerial views of an area. In some instances, the map data 816 can include ground views of an area, including 360-degree ground views. The map data 816 can include measurements, dimensions, distances, and/or information for one or more items included in the map data 816 and/or relative to other items included in the map data 816. The map data 816 can include a digital map with information about road geometry. The map data 816 can be high quality and/or highly detailed.

In one or more arrangements, the map data 816 can include one or more terrain maps 817. The terrain maps 817 can include information about the ground, terrain, roads, surfaces, and/or other features of one or more geographic areas. The terrain maps 817 can include elevation data in the one or more geographic areas. The map data 816 can be high quality and/or highly detailed. The terrain maps 817 can define one or more ground surfaces, which can include paved roads, unpaved roads, land, and other things that define a ground surface.

In one or more arrangements, the map data 816 can include one or more static obstacle maps 818. The static obstacle map(s) 818 can include information about one or more static obstacles located within one or more geographic areas. A "static obstacle" is a physical object whose position does not change or substantially change over a period of time and/or whose size does not change or substantially change over a period of time. Examples of static obstacles include trees, buildings, curbs, fences, railings, medians, utility poles, statues, monuments, signs, benches, furniture, mailboxes, large rocks, hills. The static obstacles can be objects that extend above ground level. The one or more static obstacles included in the static obstacle map(s) 818 can have location data, size data, dimension data, material data, and/or other data associated with it. The static obstacle map(s) 818 can include measurements, dimensions, distances, and/or information for one or more static obstacles. The static obstacle map(s) 818 can be high quality and/or highly detailed. The static obstacle map(s) 818 can be updated to reflect changes within a mapped area.

The one or more data stores 815 can include sensor data 819. In this context, "sensor data" means any information about the sensors that the vehicle 800 is equipped with, including the capabilities and other information about such sensors. As will be explained below, the vehicle 800 can include the sensor system 820. The sensor data 819 can relate to one or more sensors of the sensor system 820. As an example, in one or more arrangements, the sensor data 819 can include information on one or more LIDAR sensors 824 of the sensor system 820.

In some instances, at least a portion of the map data 816 and/or the sensor data 819 can be located in one or more data stores 815 located onboard the vehicle 800. Alternatively, or in addition, at least a portion of the map data 816 and/or the sensor data 819 can be located in one or more data stores 815 that are located remotely from the vehicle 800.

As noted above, the vehicle 800 can include the sensor system 820. The sensor system 820 can include one or more sensors. "Sensor" means any device, component and/or system that can detect, and/or sense something. The one or more sensors can be configured to detect, and/or sense in real-time. As used herein, the term "real-time" means a level of processing responsiveness that a user or system senses as sufficiently immediate for a particular process or determination to be made, or that enables the processor to keep up with some external process.

In arrangements in which the sensor system 820 includes a plurality of sensors, the sensors can work independently from each other. Alternatively, two or more of the sensors can work in combination with each other. In such a case, the two or more sensors can form a sensor network. The sensor system 820 and/or the one or more sensors can be operatively connected to the processor(s) 810, the data store(s) 815, and/or another element of the vehicle 800 (including any of the elements shown in FIG. 8). The sensor system 820 can acquire data of at least a portion of the external environment of the vehicle 800.

The sensor system 820 can include any suitable type of sensor. Various examples of different types of sensors will be described herein. However, it will be understood that the embodiments are not limited to the particular sensors described. The sensor system 820 can include one or more vehicle sensors 821. The vehicle sensors 821 can detect, determine, and/or sense information about, the vehicle 800 itself. In one or more arrangements, the vehicle sensors 821 can be configured to detect, and/or sense position and orientation changes of the vehicle 800, such as, for example, based on inertial acceleration. In one or more arrangements, the vehicle sensors 821 can include one or more accelerometers, one or more gyroscopes, an inertial measurement unit (IMU), a dead-reckoning system, a global navigation satellite system (GNSS), a global positioning system (GPS), a navigation system 847, and/or other suitable sensors. The vehicle sensors 821 can be configured to detect, and/or sense one or more characteristics of the vehicle 800. In one or more arrangements, the vehicle sensors 821 can include a speedometer to determine a current speed of the vehicle 800.

Alternatively, or in addition, the sensor system 820 can include one or more environment sensors 822 configured to acquire, and/or sense driving environment data. "Driving environment data" includes data or information about the external environment in which an autonomous vehicle is located or one or more portions thereof. For example, the one or more environment sensors 822 can be configured to detect, quantify and/or sense obstacles in at least a portion of the external environment of the vehicle 800 and/or information/data about such obstacles. Such obstacles may be stationary objects and/or dynamic objects. The one or more environment sensors 822 can be configured to detect, measure, quantify and/or sense other things in the external environment of the vehicle 800, such as, for example, lane markers, signs, traffic lights, traffic signs, lane lines, crosswalks, curbs proximate the vehicle 800, off-road objects, etc.

Various examples of sensors of the sensor system 820 will be described herein. The example sensors may be part of the one or more environment sensors 822 and/or the one or more vehicle sensors 821. However, it will be understood that the embodiments are not limited to the particular sensors described. As an example, in one or more arrangements, the sensor system 820 can include one or more radar sensors 823, one or more LIDAR sensors 824, one or more sonar sensors 825, and/or one or more cameras 826. In one or more arrangements, the one or more cameras 826 can be high dynamic range (HDR) cameras or infrared (IR) cameras.

The vehicle 800 can include an input system 830. An "input system" includes any device, component, system, element or arrangement or groups thereof that enable information/data to be entered into a machine. The input system 830 can receive an input from a vehicle passenger (e.g., a driver or a passenger). The vehicle 800 can include an output system 835. An "output system" includes any device, component, or arrangement or groups thereof that enable information/data to be presented to a vehicle passenger (e.g., a person, a vehicle passenger, etc.).

The vehicle 800 can include one or more vehicle systems 840. Various examples of the one or more vehicle systems 840 are shown in FIG. 8. However, the vehicle 800 can include more, fewer, or different vehicle systems. It should be appreciated that although particular vehicle systems are separately defined, each or any of the systems or portions thereof may be otherwise combined or segregated via hardware and/or software within the vehicle 800. The vehicle 800 can include a propulsion system 841, a braking system 842, a steering system 843, throttle system 844, a transmission system 845, a signaling system 846, and/or a navigation system 847. Each of these systems can include one or more devices, components, and/or combination thereof, now known or later developed.

The navigation system 847 can include one or more devices, applications, and/or combinations thereof, now known or later developed, configured to determine the geographic location of the vehicle 800 and/or to determine a travel route for the vehicle 800. The navigation system 847 can include one or more mapping applications to determine a travel route for the vehicle 800. The navigation system 847 can include a global positioning system, a local positioning system or a geolocation system.

The processor(s) 810 (and/or processor 110), the simulation system 100, and/or the autonomous driving module(s) 860 can be operatively connected to communicate with the various vehicle systems 840 and/or individual components thereof. For example, returning to FIG. 8, the processor(s) 810 and/or the autonomous driving module(s) 860 can be in communication to send and/or receive information from the various vehicle systems 840 to control the movement, speed, maneuvering, heading, direction, etc. of the vehicle 800. The processor(s) 110, the simulation system 100, and/or the autonomous driving module(s) 860 may control some or all of these vehicle systems 840 and, thus, may be partially or fully autonomous.

The processor(s) 110, the simulation system 100, and/or the autonomous driving module(s) 860 can be operatively connected to communicate with the various vehicle systems 840 and/or individual components thereof. For example, returning to FIG. 8, the processor(s) 810, the simulation system 100, and/or the autonomous driving module(s) 860 can be in communication to send and/or receive information from the various vehicle systems 840 to control the movement, speed, maneuvering, heading, direction, etc. of the vehicle 800. The processor(s) 110, the simulation system 100, and/or the autonomous driving module(s) 860 may control some or all of these vehicle systems 840. For example, the processor 810, in one embodiment, controls the camera 826 to acquire images of an area surrounding the vehicle, which are then provided to the simulation system 100 to extract content about the environment so that the autonomous driving module 860 can make determinations about how to control the vehicle 800.

The processor(s) 810, the simulation system 100, and/or the autonomous driving module(s) 860 may be operable to control the navigation and/or maneuvering of the vehicle 800 by controlling one or more of the vehicle systems 840 and/or components thereof. For instance, when operating in an autonomous mode, the processor(s) 810, the simulation system 100, and/or the autonomous driving module(s) 860 can control the direction and/or speed of the vehicle 800. The processor(s) 810, the simulation system 100, and/or the autonomous driving module(s) 860 can cause the vehicle 800 to accelerate (e.g., by increasing the supply of fuel provided to the engine), decelerate (e.g., by decreasing the supply of fuel to the engine and/or by applying brakes) and/or change direction (e.g., by turning the front two wheels). As used herein, "cause" or "causing" means to make, force, compel, direct, command, instruct, and/or enable an event or action to occur or at least be in a state where such event or action may occur, either in a direct or indirect manner.

The vehicle 800 can include one or more actuators 850. The actuators 850 can be any element or combination of elements operable to modify, adjust and/or alter one or more of the vehicle systems 840 or components thereof to responsive to receiving signals or other inputs from the processor(s) 810 and/or the autonomous driving module(s) 860. Any suitable actuator can be used. For instance, the one or more actuators 850 can include motors, pneumatic actuators, hydraulic pistons, relays, solenoids, and/or piezoelectric actuators, just to name a few possibilities.

The vehicle 800 can include one or more modules, at least some of which are described herein. The modules can be implemented as computer-readable program code that, when executed by a processor 810, implement one or more of the various processes described herein. One or more of the modules can be a component of the processor(s) 810, or one or more of the modules can be executed on and/or distributed among other processing systems to which the processor(s) 810 is operatively connected. The modules can include instructions (e.g., program logic) executable by one or more processor(s) 810. Alternatively, or in addition, one or more data store 815 may contain such instructions.

In one or more arrangements, one or more of the modules described herein can include artificial or computational intelligence elements, e.g., neural network, fuzzy logic or other machine learning algorithms. Further, in one or more arrangements, one or more of the modules can be distributed among a plurality of the modules described herein. In one or more arrangements, two or more of the modules described herein can be combined into a single module.

The vehicle 800 can include one or more autonomous driving modules 860. The autonomous driving module(s) 860 can be configured to receive data from the sensor system 820 and/or any other type of system capable of capturing information relating to the vehicle 800 and/or the external environment of the vehicle 800. In one or more arrangements, the autonomous driving module(s) 860 can use such data to generate one or more driving scene models. The autonomous driving module(s) 860 can determine the position and velocity of the vehicle 800. The autonomous driving module(s) 860 can determine the location of obstacles, objects, or other environmental features including traffic signs, trees, shrubs, neighboring vehicles, pedestrians, etc.

The autonomous driving module(s) 860 can be configured to receive, and/or determine location information for obstacles within the external environment of the vehicle 800 for use by the processor(s) 810, and/or one or more of the modules 860 described herein to estimate position and orientation of the vehicle 800, vehicle position in global coordinates based on signals from a plurality of satellites, or any other data and/or signals that could be used to determine the current state of the vehicle 800 or determine the position of the vehicle 800 with respect to its environment for use in either creating a map or determining the position of the vehicle 800 in respect to map data.

The autonomous driving modules 860 either independently or in combination can be configured to determine travel path(s), current autonomous driving maneuvers for the vehicle 800, future autonomous driving maneuvers and/or modifications to current autonomous driving maneuvers based on data acquired by the sensor system 820, driving scene models, and/or data from any other suitable source such as determinations from the sensor data. "Driving maneuver" means one or more actions that affect the movement of a vehicle. Examples of driving maneuvers include: accelerating, decelerating, braking, turning, moving in a lateral direction of the vehicle 800, changing travel lanes, merging into a travel lane, and/or reversing, just to name a few possibilities. The autonomous driving module(s) 860 can be configured to implement determined driving maneuvers. The autonomous driving module(s) 860 can cause, directly or indirectly, such autonomous driving maneuvers to be implemented. As used herein, "cause" or "causing" means to make, command, instruct, and/or enable an event or action to occur or at least be in a state where such event or action may occur, either in a direct or indirect manner. The autonomous driving module(s) 860 can be configured to execute various vehicle functions and/or to transmit data to, receive data from, interact with, and/or control the vehicle 800 or one or more systems thereof (e.g., one or more of vehicle systems 840).

Detailed embodiments are disclosed herein. However, it is to be understood that the disclosed embodiments are intended only as examples. Therefore, specific structural and functional details disclosed herein are not to be interpreted as limiting, but merely as a basis for the claims and as a representative basis for teaching one skilled in the art to variously employ the aspects herein in virtually any appropriately detailed structure. Further, the terms and phrases used herein are not intended to be limiting but rather to provide an understandable description of possible implementations. Various embodiments are shown in FIGS. 1-8, but the embodiments are not limited to the illustrated structure or application.

The flowcharts and block diagrams in the figures illustrate the architecture, functionality, and operation of possible implementations of systems, methods, and computer program products according to various embodiments. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components and/or processes described above can be realized in hardware or a combination of hardware and software and can be realized in a centralized fashion in one processing system or in a distributed fashion where different elements are spread across several interconnected processing systems. Any kind of processing system or another apparatus adapted for carrying out the methods described herein is suited. A typical combination of hardware and software can be a processing system with computer-usable program code that, when being loaded and executed, controls the processing system such that it carries out the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to carry out these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a read-only memory (ROM), an erasable programmable read-only memory (EPROM or Flash memory), a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

Program code embodied on a computer-readable medium may be transmitted using any appropriate medium, including but not limited to wireless, wireline, optical fiber, cable, RF, etc., or any suitable combination of the foregoing. Computer program code for carrying out operations for aspects of the present arrangements may be written in any combination of one or more programming languages, including an object-oriented programming language such as Java™ Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e. open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC or ABC).

Aspects herein can be embodied in other forms without departing from the spirit or essential attributes thereof. Accordingly, reference should be made to the following claims, rather than to the foregoing specification, as indicating the scope hereof.

What is claimed is:

1. A simulation system, comprising:
   one or more processors;
   a memory communicably coupled to the one or more processors and storing:
   an input module including instructions that when executed by the one or more processors cause the one or more processors to, in response to receiving a request to generate simulated sensor data for a scene, acquire simulation data about the scene, wherein the simulation data includes at least simulated information about the scene that is computer-generated; and a simulation module including instructions that, when executed by the one or more processors, cause the one or more processors to compute the simulated sensor data using a generative neural network that accepts the simulation data as an input and produces the simulated sensor data as an output, wherein the simulated sensor data is a simulated perception of the scene by a sensor, wherein the generative neural network includes a first generative network for producing the simulated sensor data, and a second generative network for inferring semantic labels, wherein the simulation module includes instructions to train the generative neural network by computing at least a cycle consistency loss that indicates a transitive relationship between learned mappings of the first generative network and the second generative network, and that includes a forward cycle consistency and a backward cycle consistency.

2. The simulation system of claim 1, wherein the simulated data about the scene includes semantic labels identifying objects depicted in the scene and ranges of the objects from a perspective of the sensor, wherein the simulation data simulates at least range information associated with the scene as perceived by at least one of: an image sensor and a light detection and ranging (LiDAR) sensor, and wherein the simulated sensor data is intensity data that indicates intensities of reflected light from observed points on the objects, and wherein the intensities correspond with one or more attributes of the objects.

3. The simulation system of claim 1, wherein the input module includes instructions to acquire the simulation data including instructions to simulate the scene using a rendering engine that produces the scene as a three-dimensional environment including objects and spatial relationships between the objects to produce the simulation data, and wherein the simulation data includes semantic labels and range data for the scene.

4. The simulation system of claim 1, wherein the simulation module includes instructions to provide the simulated sensor data including instructions to generate an intensity map and integrate the intensity map with a simulation for the scene to correlate the simulated sensor data with objects in the scene, and wherein the simulation including the scene is computer-generated and provides inputs for training one or more machine learning tasks.

5. The simulation system of claim 1, wherein the generative neural network is a generative adversarial network (GAN) that includes the first generative network for producing the simulated sensor data, a first discriminator, the second generative network for inferring semantic labels, and a second discriminator, and wherein the simulation module includes instructions to compute the simulated sensor data using the generative neural network including using learned correlations embodied within the first generative network to infer the simulated sensor data from the simulation data.

6. The simulation system of claim 5, wherein the simulation module includes instructions to train the generative neural network using an unsupervised learning process that includes using the first discriminator to assess first output data of the first generative network in comparison with training data and using the second discriminator to assess second output data of the second generative network in comparison with the training data, the training data including training sensor data and training semantic labels associated with at least one training scene.

7. The simulation system of claim 6, wherein the simulation module includes instructions to train including instructions to iteratively compute a loss according to a loss function and adjusting parameters of the generative neural network according to the loss, and wherein the simulation module includes instructions to iteratively compute the loss including instructions to compute an adversarial loss and the cycle consistency loss, the adversarial loss indicating at least an objective loss associated with the first discriminator identifying whether the first output data is computer generated.

8. A non-transitory computer-readable medium including instructions that when executed by one or more processors cause the one or more processors to:

in response to receiving a request to generate simulated sensor data for a scene, acquire simulation data about the scene, wherein the simulation data includes at least simulated information about the scene that is computer-generated;

compute the simulated sensor data using a generative neural network that accepts the simulation data as an input and produces the simulated sensor data as an output, wherein the generative neural network includes a first generative network for producing the simulated sensor data, and a second generative network for inferring semantic labels, wherein the simulated sensor data is a simulated perception of the scene by a sensor; and train the generative neural network by computing at least a cycle consistency loss that indicates a transitive relationship between learned mappings of the first generative network and the second generative network, and that includes a forward cycle consistency and a backward cycle consistency.

9. The non-transitory computer-readable medium of claim 8, wherein the simulated data about the scene includes semantic labels identifying objects depicted in the scene and ranges of the objects from a perspective of the sensor, wherein the simulation data simulates at least range information associated with the scene as perceived by at least one of: an image sensor and a light detection and ranging (LiDAR) sensor, and wherein the simulated sensor data is intensity data that indicates intensities of reflected light from observed points on the objects, and wherein the intensities correspond with one or more attributes of the objects.

10. The non-transitory computer-readable medium of claim 8, wherein the instructions to acquire the simulation data include instructions to simulate the scene using a rendering engine that produces the scene as a three-dimensional environment including objects and spatial relationships between the objects to produce the simulation data, and wherein the simulation data includes semantic labels and range data for the scene.

11. The non-transitory computer-readable medium of claim 8, wherein the instructions to provide the simulated sensor data include instructions to generate an intensity map and integrate the intensity map with a simulation for the scene to correlate the simulated sensor data with objects in the scene, and wherein the simulation including the scene is computer-generated and provides inputs for training one or more machine learning tasks.

12. The non-transitory computer-readable medium of claim 8, wherein the generative neural network is a generative adversarial network (GAN) that includes the first generative network for producing the simulated sensor data, a first discriminator, the second generative network for inferring semantic labels, and a second discriminator, and further includes instructions to train the generative neural network using an unsupervised learning process that includes using the first discriminator to assess first output data of the first generative network in comparison with training data and using the second discriminator to assess second output data of the second generative network in comparison with the training data, the training data including training sensor data and training semantic labels associated with at least one training scene.

13. A method, comprising:

in response to receiving a request to generate simulated sensor data for a scene, acquiring simulation data about the scene, wherein the simulation data includes at least simulated information about the scene that is computer-generated;

computing the simulated sensor data using a generative neural network that accepts the simulation data as an input and produces the simulated sensor data as an output, wherein the generative neural network includes a first generative network for producing the simulated sensor data, and a second generative network for inferring semantic labels, wherein the simulated sensor data is a simulated perception of the scene by a sensor; and training the generative neural network by computing at least a cycle consistency loss that indicates a transitive relationship between learned mappings of the first generative network and the second generative network and that includes a forward cycle consistency and a backward cycle consistency.

14. The method of claim 13, wherein the simulated data about the scene includes semantic labels identifying objects depicted in the scene and ranges of the objects from a perspective of the sensor, wherein the simulation data simulates at least range information associated with the scene as perceived by at least one of: an image sensor and a light detection and ranging (LiDAR) sensor, and wherein the simulated sensor data is intensity data that indicates intensities of reflected light from observed points on the objects, and wherein the intensities correspond with one or more attributes of the objects.

15. The method of claim 13, wherein acquiring the simulation data includes simulating the scene according to a rendering engine that produces the scene as a three-dimensional environment including objects and spatial relationships between the objects to produce the simulation data, and wherein the simulation data includes semantic labels and range data for the scene.

16. The method of claim 13, wherein providing the simulated sensor data includes generating an intensity map and integrating the intensity map with a simulation for the scene to correlate the simulated sensor data with objects in the scene, and wherein the simulation including the scene is computer-generated and provides inputs for training one or more machine learning tasks.

17. The method of claim 13, wherein the generative neural network is a generative adversarial network (GAN) that includes the first generative network for producing the simulated sensor data, a first discriminator, the second generative network for inferring semantic labels, and a second discriminator, and wherein computing the simulated sensor data using the generative neural network includes using learned correlations embodied within the first generative network to infer the simulated sensor data from the simulation data.

18. The method of claim 17, wherein training the generative neural network using an unsupervised learning process includes using the first discriminator to assess first output data of the first generative network in comparison with training data and using the second discriminator to assess second output data of the second generative network in comparison with the training data, the training data including training sensor data and training semantic labels associated with at least one training scene.

19. The method of claim 18, wherein training includes iteratively computing a loss according to a loss function and adjusting parameters of the generative neural network according to the loss, and wherein computing the loss includes computing an adversarial loss and a cycle consistency loss, the adversarial loss indicating at least an objective loss associated with the first discriminator identifying whether the first output data is computer generated.

* * * * *